United States Patent
Suminaga et al.

[11] Patent Number: 6,128,210
[45] Date of Patent: Oct. 3, 2000

[54] SEMICONDUCTOR MEMORY DEVICE

[75] Inventors: Yasuo Suminaga, Mie-ken; Koji Komatsu, Nara, both of Japan

[73] Assignee: Sharp Kabushiki Kaisha, Japan

[21] Appl. No.: 09/419,739

[22] Filed: Oct. 16, 1999

[30] Foreign Application Priority Data

Oct. 16, 1998 [JP] Japan .................................. 10-295887

[51] Int. Cl.$^7$ .................................................. G11C 5/06
[52] U.S. Cl. ........................ 365/63; 365/51; 365/185.11; 365/230.03
[58] Field of Search ................... 365/63, 51, 52, 365/185.11, 185.13, 230.03

[56] References Cited

U.S. PATENT DOCUMENTS

| | | | |
|---|---|---|---|
| 5,202,848 | 4/1993 | Nakagawara | 365/104 |
| 5,621,697 | 4/1997 | Weng et al. | 365/230.06 |
| 5,822,248 | 10/1998 | Satori et al. | 365/185.21 |
| 5,923,606 | 7/1999 | Lee et al. | 365/230.03 |
| 5,978,255 | 11/1999 | Naritake | 365/149 |
| 6,002,606 | 12/1999 | Komatsu | 365/63 |

*Primary Examiner*—Richard Elms
*Assistant Examiner*—Hien Nguyen
*Attorney, Agent, or Firm*—Morrison & Foerster LLP

[57] ABSTRACT

A semiconductor memory device includes a plurality of main bit lines; a first bank including a plurality of memory cells, a plurality of word lines, and a plurality of sub bit lines; a second bank including a plurality of memory cells, a plurality of word lines, and a plurality of sub bit lines which are independent from the plurality of sub bit lines included in the first bank; a first auxiliary conduction region coupled to one of the plurality of main bit lines; a first switch for electrically connecting the first auxiliary conduction region to a second auxiliary conduction region: and a second switch for electrically connecting one of the plurality of sub bit lines included in the first bank to the second auxiliary conduction region.

15 Claims, 8 Drawing Sheets

⊠ : LOCOS region

SEMICONDUCTOR MEMORY DEVICE

BACKGROUND OF THE INVENTION

1. Field of the Invention

The present invention relates to a semiconductor memory device employing a layered bit line system, in which main bit lines provided over sub bit lines are selectively connected to the sub bit lines. More specifically, the present invention relates to a semiconductor memory device in which a load on the main bit line is reduced, thereby realizing high-speed access.

2. Description of the Related Art

U.S. Pat. No. 5,621,697 discloses a semiconductor memory device employing a layered bit line system.

FIG. 6 shows a semiconductor memory device 100 employing the conventional layered bit line system.

The semiconductor memory device 100 includes a plurality of banks BNK100, BNK101 and BNK102.

The banks BNK100, BNK101 and BNK102 each include a plurality of memory cells M, a plurality of sub bit lines SB, a plurality of wordlines WL, a first bank select line BL, and a second bank select line BS.

The banks BNK100 and BNK101 share sub bit lines SB11, SB15 and SB19. The banks BNK101 and BNK102 share sub bit lines SB13 and SB17.

U.S. Pat. No. 5,202,848 discloses another semiconductor memory device employing a layered bit line system.

FIGS. 7 and 8 show another semiconductor memory device 200 employing the conventional layered bit line system.

The semiconductor memory device 200 includes a plurality of banks BNK0, BNK1 and BNK2, auxiliary conduction regions BB11–BB22, a plurality of main bit lines MB1–MB4, and a plurality of contacts CT11–CT22. Specifically, the first bank BNK1 includes a plurality of sub bit lines SB11–SB17, and the second bank BNK2 includes a plurality of sub bit lines SB21–SB27. The plurality of sub bit lines SB11–SB17 included in the first bank BNK1 are electrically isolated from the plurality of sub bit lines SB21–SB27 included in the second bank BNK2.

Switches TB15 and TB16 of the first bank BNK1 and switches TB25 and TB26 of the second bank BNK2 are coupled to the auxiliary conduction region BB21. Specifically, the switch TB15 is coupled to the sub bit line SB11; the switch TB16 is coupled to the sub bit line SB13; the switch TB25 is coupled to the sub bit line SB21; and the switch TB26 is coupled to the sub bit line SB23. That is, in the semiconductor memory device 200, four switches (e.g., the switches TB15, TB16, TB25, and TB26) are directly coupled to a single auxiliary conduction region (e.g., the auxiliary conduction region BB21).

In the semiconductor memory device 100 (FIG. 6), first switches TB12 and TB21 and a second switch TC16 are turned ON in order to read data stored in a memory cell M4. A source electrode and a drain electrode of the memory cell M4 are connected to the main bit lines MB2 and MB3, respectively. At this time, the main bit line MB2 is connected to the sub bit line SB13 which is commonly included in both the bank BNK101 and the bank BNK102 through the first switch TB21, and the main bit line MB3 is connected to the sub bit line SB15 which is commonly included in both the bank BNK100 and the bank BNK101 through the first switch TB12. Thus, a load increases when data is read out, whereby the semiconductor memory device 100 cannot read data at a high speed.

In the semiconductor memory device 200, since four switches are directly coupled to a single auxiliary conduction region, a capacity between a gate and a drain of a switch, or a junction capacity between a substrate and a drain increases. Therefore, data cannot be read at a high speed.

SUMMARY OF THE INVENTION

A semiconductor memory device according to the present invention includes a plurality of main bit lines; a first bank including a plurality of memory cells, a plurality of word lines, and a plurality of sub bit lines; a second bank including a plurality of memory cells, a plurality of word lines, and a plurality of sub bit lines which are independent from the plurality of sub bit lines included in the first bank; a first auxiliary conduction region coupled to one of the plurality of main bit lines; a first switch for electrically connecting the first auxiliary conduction region to a second auxiliary conduction region: and a second switch for electrically connecting one of the plurality of sub bit lines included in the first bank to the second auxiliary conduction region.

In one embodiment of the invention, the first bank and the second bank share the first auxiliary conduction region, the second auxiliary conduction region, and the first switch.

In one embodiment of the invention, the semiconductor memory device includes a semiconductor substrate of one conductive type, wherein the plurality of sub bit lines included in the first and second banks have a conductive type opposite to the conductive type of the semiconductor substrate.

In one embodiment of the invention, the first and second auxiliary conduction regions have a conductive type identical with that of the plurality of sub bit lines included in the first and second banks.

In one embodiment of the invention, the semiconductor memory device further includes another first switch for connecting the first auxiliary conduction region to another second auxiliary conduction region: and another second switch for connecting one of the plurality of sub bit lines included in the first bank to said another second auxiliary conduction region.

In one embodiment of the invention, the first auxiliary conduction region is interposed between the second auxiliary conduction region and said another second auxiliary conduction region.

In one embodiment of the invention, the semiconductor memory device further includes another second switch for electrically connecting one of the plurality of the sub bit lines included in the first bank to the second auxiliary conduction region.

In one embodiment of the invention, a device isolation region formed by the LOCOS method is positioned around the first auxiliary conduction region.

In one embodiment of the invention, the plurality of memory cells included in the first bank are arranged in a matrix; and the plurality of memory cells included in the second bank are arranged in a matrix.

In one embodiment of the invention, each of the plurality of memory cells included in the first bank includes a gate electrode, a source electrode, and a drain electrode; a portion of each of the plurality of word lines included in the first bank functions as the gate electrode of the plurality of memory cells included in the first bank; a portion of each of the plurality of sub bit lines included in the first bank functions as one of the source electrode and the drain electrode of the plurality of memory cells included in the first bank; each of the plurality of memory cells included in the second bank has a gate electrode, a source electrode, and a drain electrode; a portion of each of the plurality of word lines included in the second bank functions as the gate electrode of the plurality of memory cells included in the second bank; and a portion of each of the plurality of sub bit lines included in the second bank functions as one of the source electrode and the drain electrode of the plurality of memory cells included in the second bank.

In one embodiment of the invention, the plurality of the sub bit lines included in the first and second banks are placed so as to be generally parallel to each other with a predetermined distance therebetween; the plurality of the sub bit lines included in the first bank are in non-parallel relation to the plurality of the word lines included in the first bank; and the plurality of the sub bit lines included in the second bank are in non-parallel relation to the plurality of the word lines included in the second bank.

In one embodiment of the invention, the plurality of the word lines included in the first bank are parallel to the plurality of the word lines included in the second bank; a bank select line is arranged so as to be generally parallel to the plurality of word lines included in the first and second banks: and a portion of the bank select line functions as a gate electrode of a bank cell.

In one embodiment of the invention, the plurality of main bit lines are made of metal interconnections and arranged so as to be generally parallel to the sub bit lines included in the first and second banks.

In one embodiment of the invention, a channel region of one of the plurality of memory cells included in the first bank is formed between two adjoining sub bit lines among the plurality of sub bit lines included in the first bank.

In one embodiment of the invention, the plurality of the sub bit lines included in the first bank are parallel to the plurality of the sub bit lines included in the second bank; and the plurality of main bit lines are made of metal interconnections and arranged so as to be generally parallel to the plurality of sub bit lines in the first and second banks.

Hereinafter, functions of the present invention will be described.

In a semiconductor memory device according to the present invention, a plurality of sub bit lines included in a first bank are independent from a plurality of sub bit lines included in a second bank. Therefore, when data stored in a memory cell is read out, only two sub bit lines in a bank including said memory cell are selected. That is, sub bit lines included in a bank containing data to be read are electrically isolated from sub bit lines included in a bank containing data not to be read. As a result, a load connected to main bit lines is reduced.

Furthermore, since one (FIG. 1) or two (FIG. 4) first bank select transistors (hereinafter, referred to as switches) are directly coupled to a single auxiliary conduction region, first switches can be sparsely provided. Thus, the LOCOS method can be employed for device isolation and therefore a load capacitance can be further reduced as compared to a case where device isolation is made by ion implantation.

Thus, the invention described herein makes possible the advantage of providing a semiconductor memory device capable of reading data at a high speed.

This and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of the present invention will be described with reference to the drawings.

(Embodiment 1)

Figure 1:
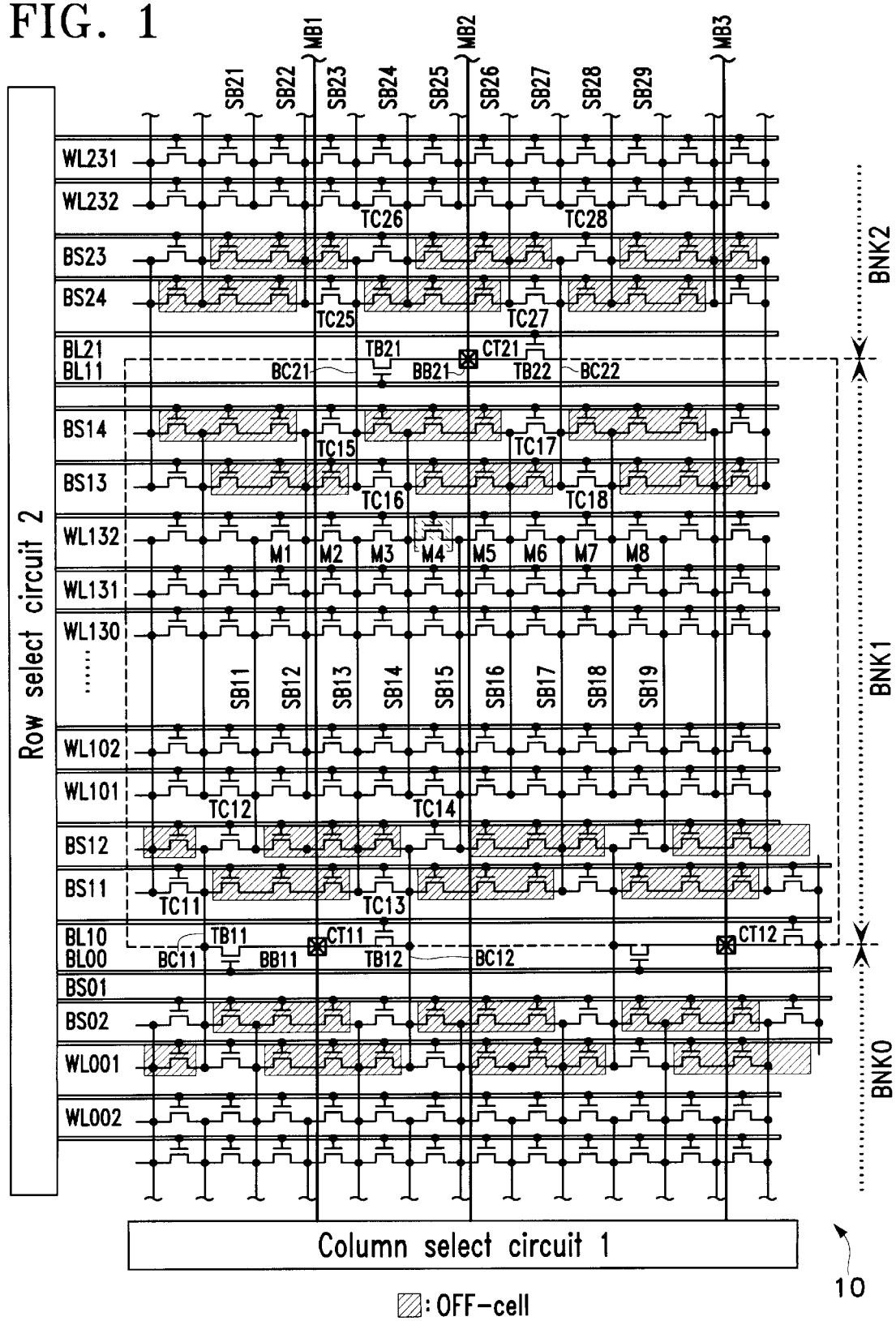
FIG. 1 shows a portion of an equivalent circuit in a mask ROM 10 capable of programming by ion implantation.

FIG. 1 shows a portion of an equivalent circuit in a mask ROM 10 capable of programming by ion implantation.

A mask ROM 10 includes a plurality of banks BNK0, BNK1 and BNK2.

The bank BNK1 includes a plurality of memory cells M, a plurality of sub bit lines SB, a plurality of wordlines WL, first bank select lines BL, and second bank select lines BS.

The plurality of memory cells M are arranged in a matrix. The memory cells M each include a source electrode, a drain electrode and a gate electrode. The names of elements used herein, "source" and "drain", are given for convenience. The elements herein called "source" and "drain" may alternatively be referred to as "drain" and "source", respectively. It is preferable that the memory cells M be MOS (Metal Oxide Semiconductor) FETs.

Drain/source electrodes of the memory cells M are coupled to the sub bit lines SB. The plurality of the bit lines SB are arranged so as to be generally parallel to each other in a column direction with a constant distance therebetween. For example, a source electrode of a memory cell M4 is coupled to a sub bit line SB14, and a drain electrode of the memory cell M4 is coupled to a sub bit line SB15 adjoining the sub bit line SB14. Furthermore, it is preferable that the sub bit lines SB also function as the drain/source electrodes of the memory cells M.

Gate electrodes of the memory cells M are coupled to the word lines WL. The plurality of word lines WL are arranged so as to be parallel to each other in the row direction. The word lines WL cross the sub bit lines approximately at a right angle. It is preferable that the word lines WL also function as the gate electrode of the memory cells M.

The mask ROM 10 further includes contacts CT, first auxiliary conduction regions BB, second auxiliary conduction regions BC, first switches TB, and main bit lines MB. Two adjoining banks BNK share contacts CT, first auxiliary conduction regions BB, second auxiliary conduction regions BC, and first switches TB. For example, a bank BNK1 and a bank BNK2 share a contact CT21, a first auxiliary conduction region BB21, second auxiliary conduction regions BC21 and BC22, and first switches TB21 and TB22. Furthermore, the first auxiliary conduction region BB21 is interposed between the second auxiliary conduction regions BC21 and BC22.

A main bit line MB2 is coupled to the contact CT21. The contact CT21 is coupled to the second auxiliary conduction regions BC21 and BC22 through the first switches TB21 and TB22, respectively. Furthermore, the first switches TB may be bank cells.

The banks BNK include second switches TC for connecting the second auxiliary conduction regions BC to the sub bit lines SB. For example, the second auxiliary conduction region BC21 is connected to the sub bit lines SB12 and SB14 through the switches TC15 and TC16, respectively. That is, the second auxiliary conduction regions BC are not directly coupled to the sub bit lines SB but indirectly connected to the sub bit lines SB through the second switches TC. The second switches TC may be bank cells.

The sub bit lines SB extend in the row direction from one side to the other side of the bank. For example, the sub bit lines SB extend from a side of the bank BANK1 which faces the bank BANK2, to the opposite side of the bank BANK1 which faces the bank BANK0. More specifically, at one side of the bank BANK1, ends of even-numbered sub bit lines (e.g., SB12, SB14, SB16, . . . ) rather than ends of odd-numbered sub bit lines (e.g., SB11, SB13, SB15, . . . ) are closer to the contact CT21. On the other hand, at the other side of the bank BANK1, ends of odd-numbered sub bit lines (e.g., SB11, SB13, SB15, . . . ) rather than ends of even-numbered sub bit lines (e.g., SB12, SB14, SB16, . . . ) are closer to the contact CT11.

The configuration of the banks BNK0 and BNK2 is identical with that of the bank BNK1.

The sub bit lines SB included in the bank BNK1 are independent from the sub bit lines SB included in the banks BNK0 and BNK2 adjoining the bank BNK1.

Hereinafter, an operation of the mask ROM 10 will be described by illustrating a case where data is read from the memory cell M4.

A word line WL132, first bank select lines BL10 and BL11, and second bank select line BS12 and BS13 are set at a high level by a row select circuit 2, while setting the rest of the word lines, the rest of the first bank select lines, and the rest of the second bank select lines are set at a low level by the row select circuit 2. This selects only the first switches TB12 and TB21 and the second switches TC14 and TC16.

As a result, the sub bit line SB14 is connected to the main bit line MB2 through the second switch TC16, the second auxiliary conduction region BC21, the first switch TB21 and the contact CT21. The sub bit line SB15 is connected to the main bit line MB1 through the second switch TC14, the second auxiliary conduction region BC12, the first switch TB12 and the contact CT11.

Next, the main bit lines MB1 and MB2 are selectively connected to data lines (not shown) by a column select circuit 1, respectively. One of the main bit lines MB1 and MB2 is set at a high-level by the column select circuit 1, while the other of the main bit lines MB1 and MB2 is set at a low-level by the column select circuit 1. Data stored in the memory cell M4 is read as binary information according to a difference of currents flowing in a data line, or the like. When data stored in the memory cell M4 is readout, the main bit line MB2 is electrically connected to the sub bit line SB14 through the first switch TB21 and the second switch TC16, and the main bit line MB1 is electrically connected to the sub bit line SB15 through the first switch TB12 and the second switch TC14. That is, the other sub bit lines SB11 to SB13 and SB16 to SB19 are electrically isolated from the main bit lines MB1 and MB2.

Furthermore, a threshold value of the memory cells M is determined by, e.g., the amount of boron ions implanted into a channel region under a gate electrode. In a memory cell M in which ion has been implanted, the threshold value of the memory cell M becomes greater than that of a memory cell M in which ion has not been implanted. Therefore, even in the case where a gate potential of the memory cell M is at a high level, the memory cell M is in a OFF-state. On the other hand, in a memory cell M in which ion has not been implanted, when a gate potential of the memory cell M is at a high level, the memory cell M is in an ON-state.

Ions are implanted into a portion of the bank select line BS which does not constitute the second switch TC. As a result, the second switch TC is consistently in an OFF-state.

Hereinafter, an exemplary layout of a memory cell array in a mask ROM 10 of FIG. 1 will be described with reference to FIG. 2.

Figure 2:
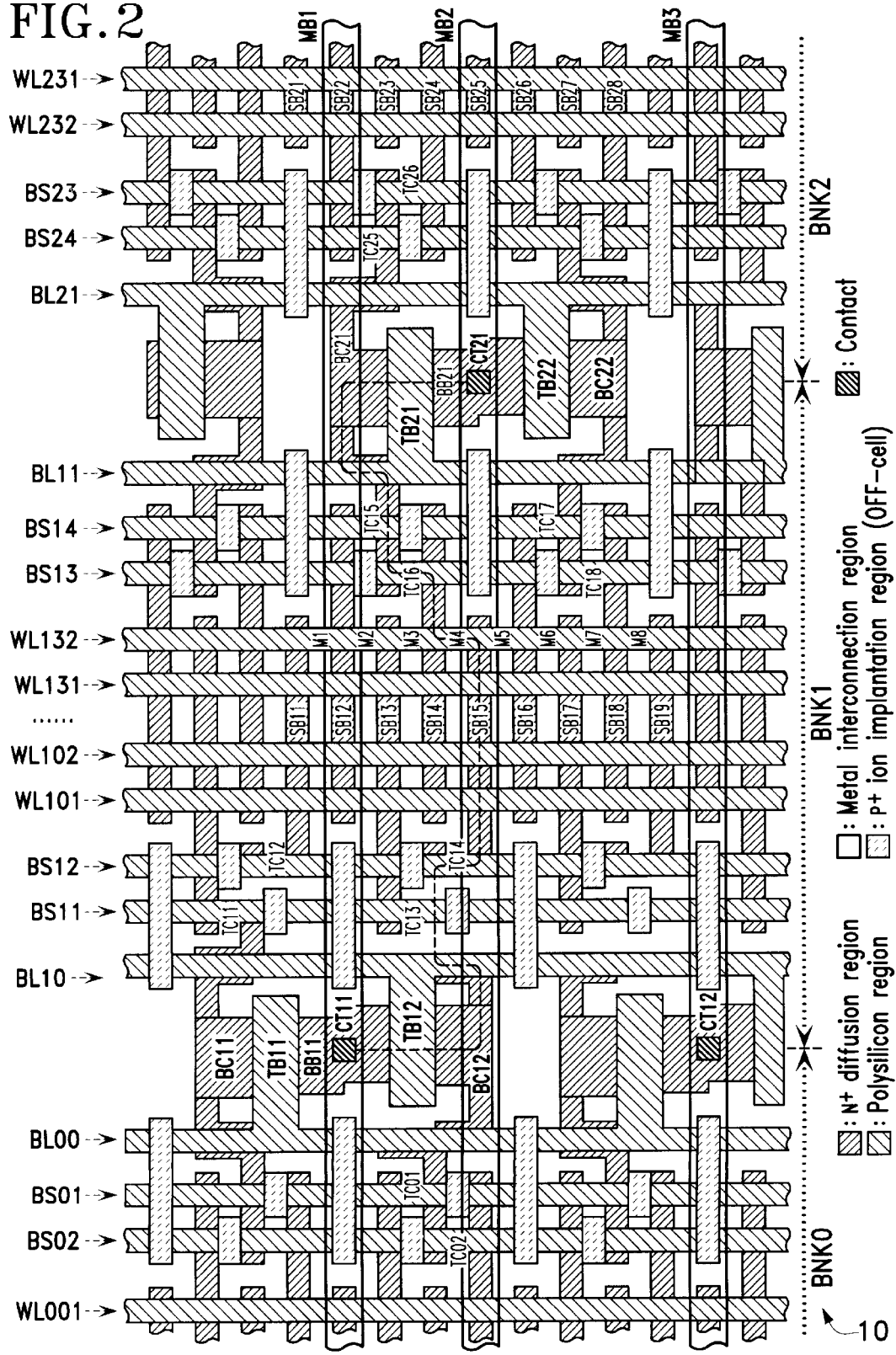
FIG. 2 shows an exemplary layout pattern of a memory cell array in the mask ROM 10.

FIG. 2 shows an exemplary layout of a memory cell array in a mask ROM 10.

The mask ROM 10 includes a p⁻-type semiconductor substrate. A plurality of sub bit lines SB are formed from an N⁺-type diffusion layer having a conductive type opposite to the conductive type of the semiconductor substrate. An insulating film is formed on the plurality of the sub bit lines SB, on which a plurality of word lines WL of a polysilicon layer are formed. The plurality of word lines WL cross the plurality of sub bit lines SB.

Memory cells M are formed between the sub bit lines SB. Specifically, a portion of the sub bit line SB functions as a source electrode or a drain electrode of the memory cells M, while a portion of the word line WL functions as a gate electrode.

The first auxiliary conduction region BB and the second auxiliary conduction region BC are formed from a N+diffusion layer having a conductive type identical with that of the sub bit lines. The first bank select line BL and the second bank select line BS are formed from polysilicon.

A first switch TB is formed between the first auxiliary conduction region BB and the second auxiliary conduction region BC. Specifically, a portion of the first auxiliary conduction region BB or the second auxiliary conduction region BC functions as a source electrode or a drain electrode of the first switch TB, while a portion of the first bank select line BL functions as a gate electrode of the first switch TB.

A second switch TC is formed between the second auxiliary conduction region BC and the sub bit line SB. Specifically, a portion of the second auxiliary conduction region BC or the sub bit line SB functions as a source electrode or a drain electrode of the second switch TC, while a portion of the second bank select line BS functions as a gate electrode of the second switch TC.

The first auxiliary conduction region BB is connected to the main bit line MB, which is a metal interconnection, through the contact CT. A broken line in FIG. 2 shows a path through which a current flows when data stored in the memory cell M4 is read out.

The mask ROM 10 of Embodiment 1 requires two main bit lines MB for eight sub bit lines SB. That is, the mask ROM 10 requires a smaller number of main bit lines MB as compared to those required in the mask ROM shown in FIG. 6.

In the case where a step is incidentally formed during the fabrication process, it becomes difficult to tightly arrange the main bit lines and the like at a high density in the upper level of the step. However, since the number of the main bit lines MB required in the mask ROM 10 of FIG. 1 is smaller than that required in the mask ROM 100 shown in FIG. 6, the main bit lines can be arranged at a high density in the mask ROM 10 of FIG. 1.

Figure 6:
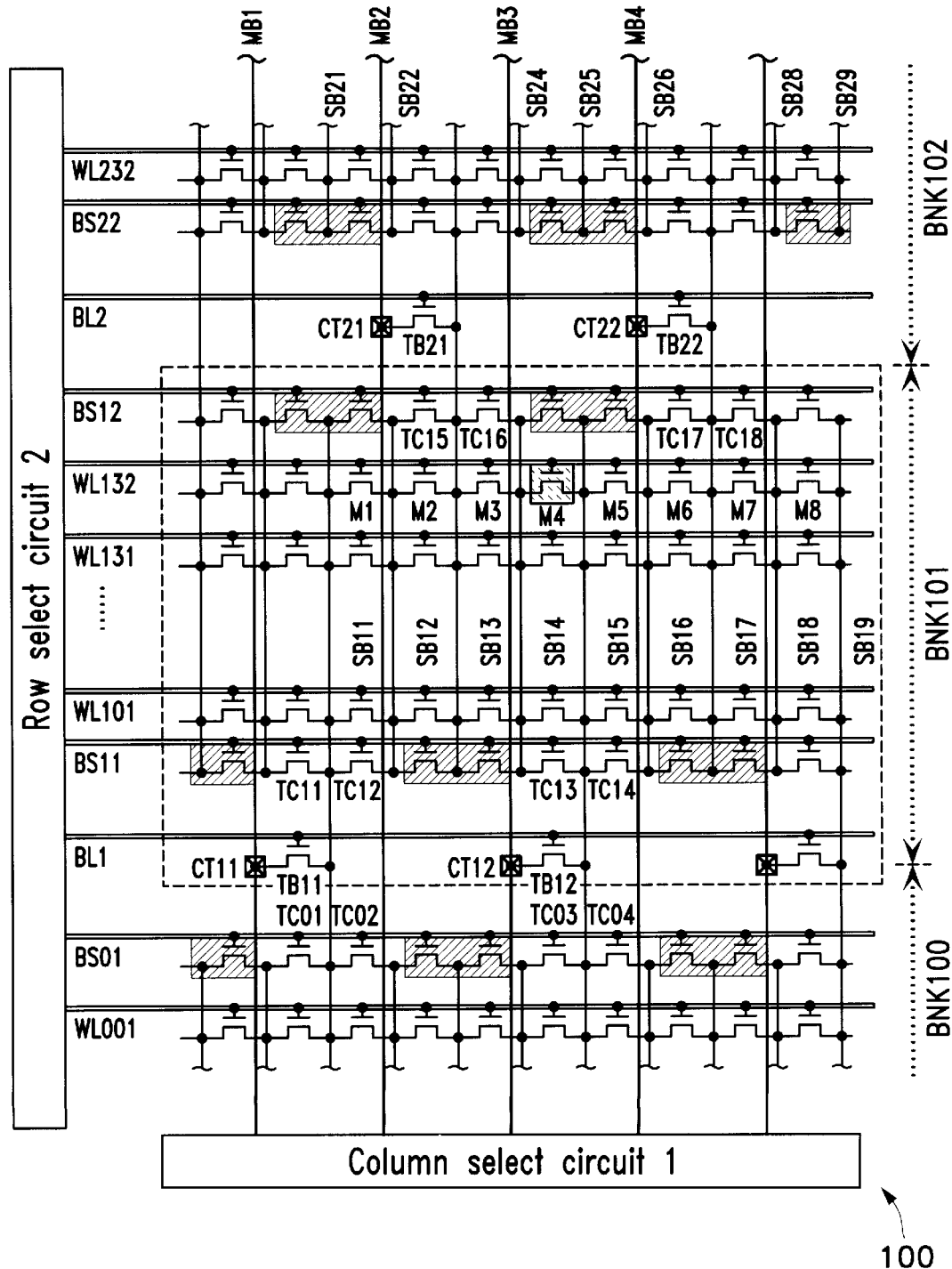
FIG. 6 shows a portion of an equivalent circuit of a semiconductor memory device 100 employing the conventional layered bit line system.
Figure 7:
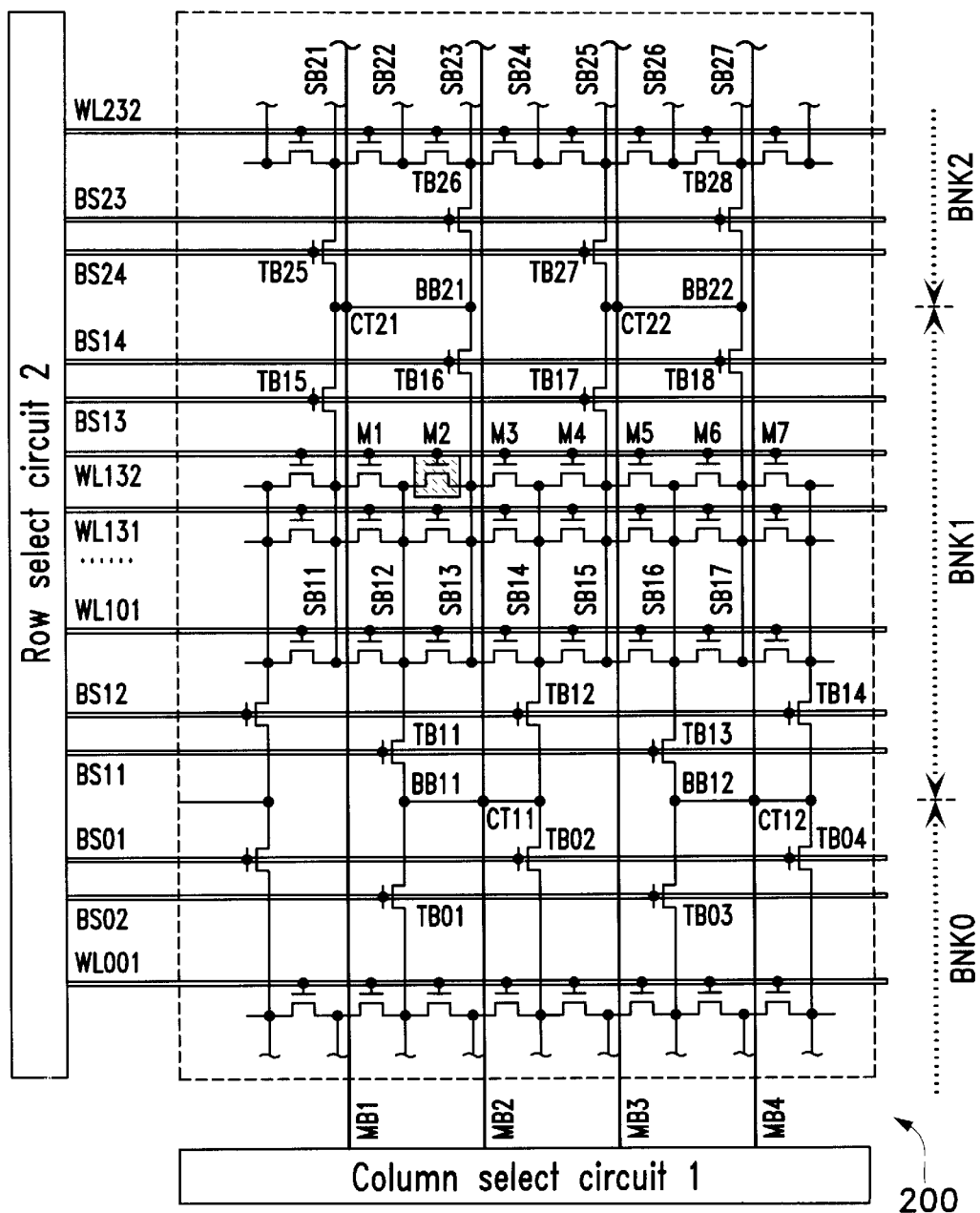
FIG. 7 shows a portion of an equivalent circuit of another semiconductor memory device 200 employing the conventional layered bit line system.
Figure 8:
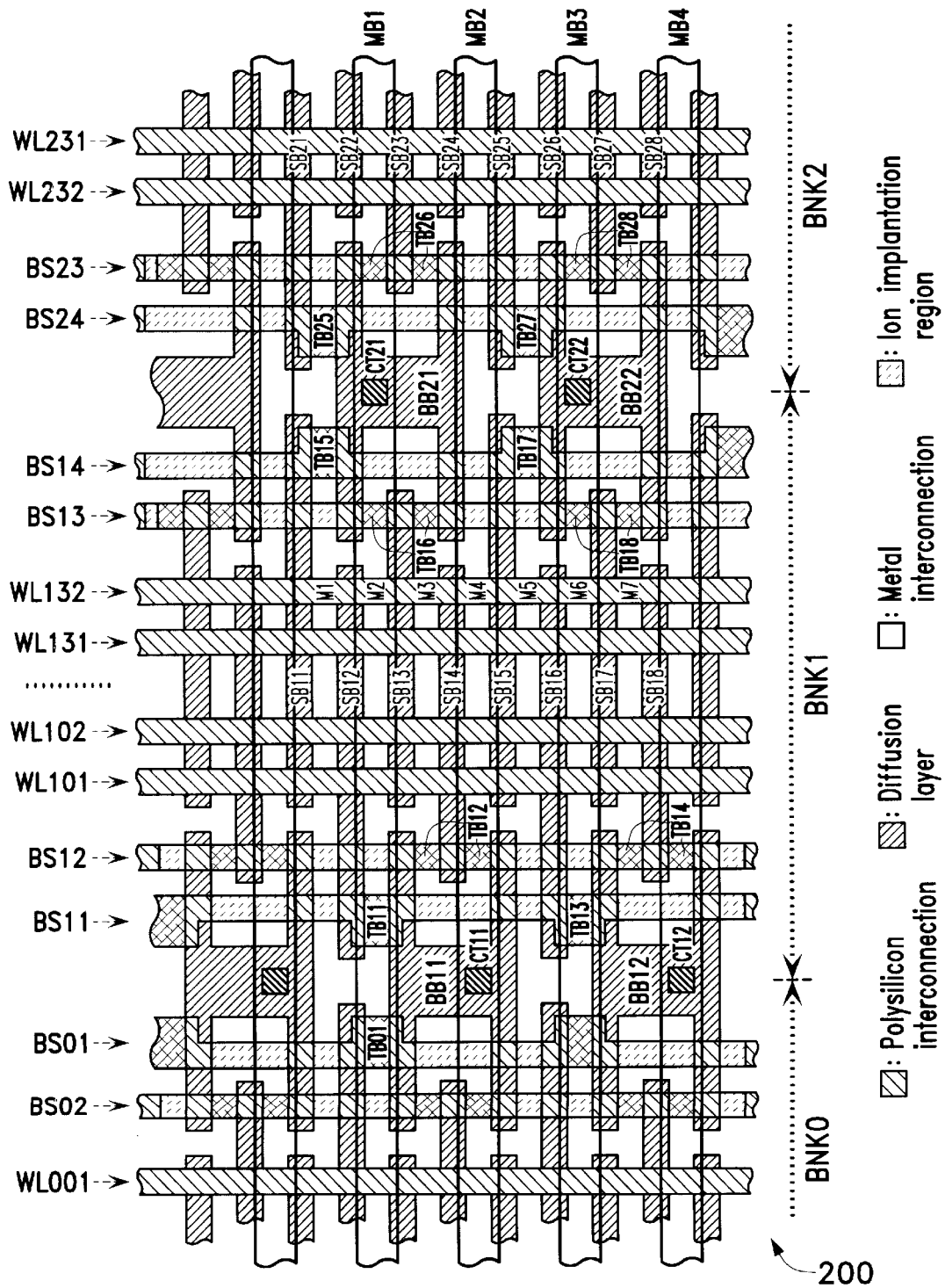
FIG. 8 shows a layout pattern of the semiconductor memory device 200 employing the conventional layered bit line system.

Furthermore, since the number of the main bit lines MB required in the mask ROM 10 of Embodiment 1 is smaller than that required in the mask ROM 100 shown in FIG. 6, the wiring capacity of the main bit lines MB in the mask ROM 10 of Embodiment 1 is smaller than that of the main bit lines MB in the mask ROM 100 shown in FIG. 6. Therefore, in the mask ROM 10 of Embodiment 1, data can be read at a higher speed than in the mask ROM 100 shown in FIG. 6.

Furthermore, a device isolating portion may be formed around the first switch TB by a LOCOS (LOCal Oxidation of Silicon) method.

Figure 3:
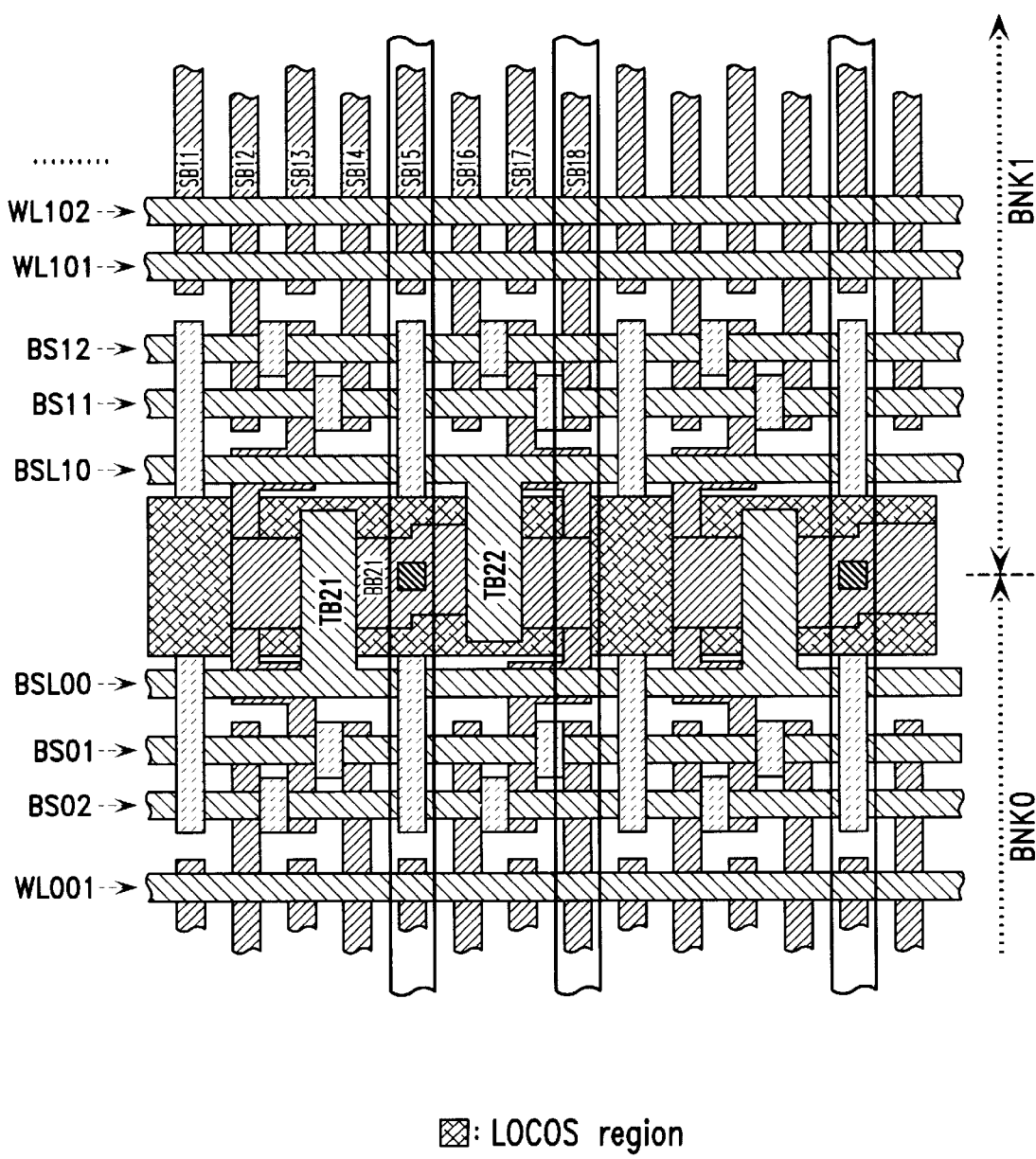
FIG. 3 shows an exemplary layout pattern of a memory cell array in the mask ROM 10, in which a first switch TB is enclosed by a device isolation region having a LOCOS structure.

FIG. 3 shows one exemplary layout of a memory cell array in the mask ROM 10 in which a first switch TB is enclosed by a device isolation region formed by the LOCOS method. The first switches TB are arranged less densely than the second switches TC. For example, a device isolation region can be formed between adjoining two of the first switches TB by the LOCOS method.

On the other hand, in the semiconductor memory device 100 shown in FIG. 6, a bird's beak is incidentally formed as a result of the formation of the device isolation region by the LOCOS method. Therefore, the semiconductor memory device 100 cannot be formed at a high density. Furthermore, in the case where the LOCOS method is not employed, a device is isolated by implanting ions of high concentration into a source and a drain of a transistor constituting a memory cell. As a result, a junction capacitance of such a device becomes larger as compared to the other memory cells.

Thus, in a semiconductor memory device shown in FIG. 3, a junction capacitance between the first auxiliary conduction region and the substrate becomes smaller as compared to the semiconductor memory device 100. As a result, in the semiconductor memory device shown in FIG. 3, a parasitic capacitance of the main bit lines MB can be reduced, and the semiconductor memory device therefore can be operated at a high speed.

(Embodiment 2)

Figure 4:
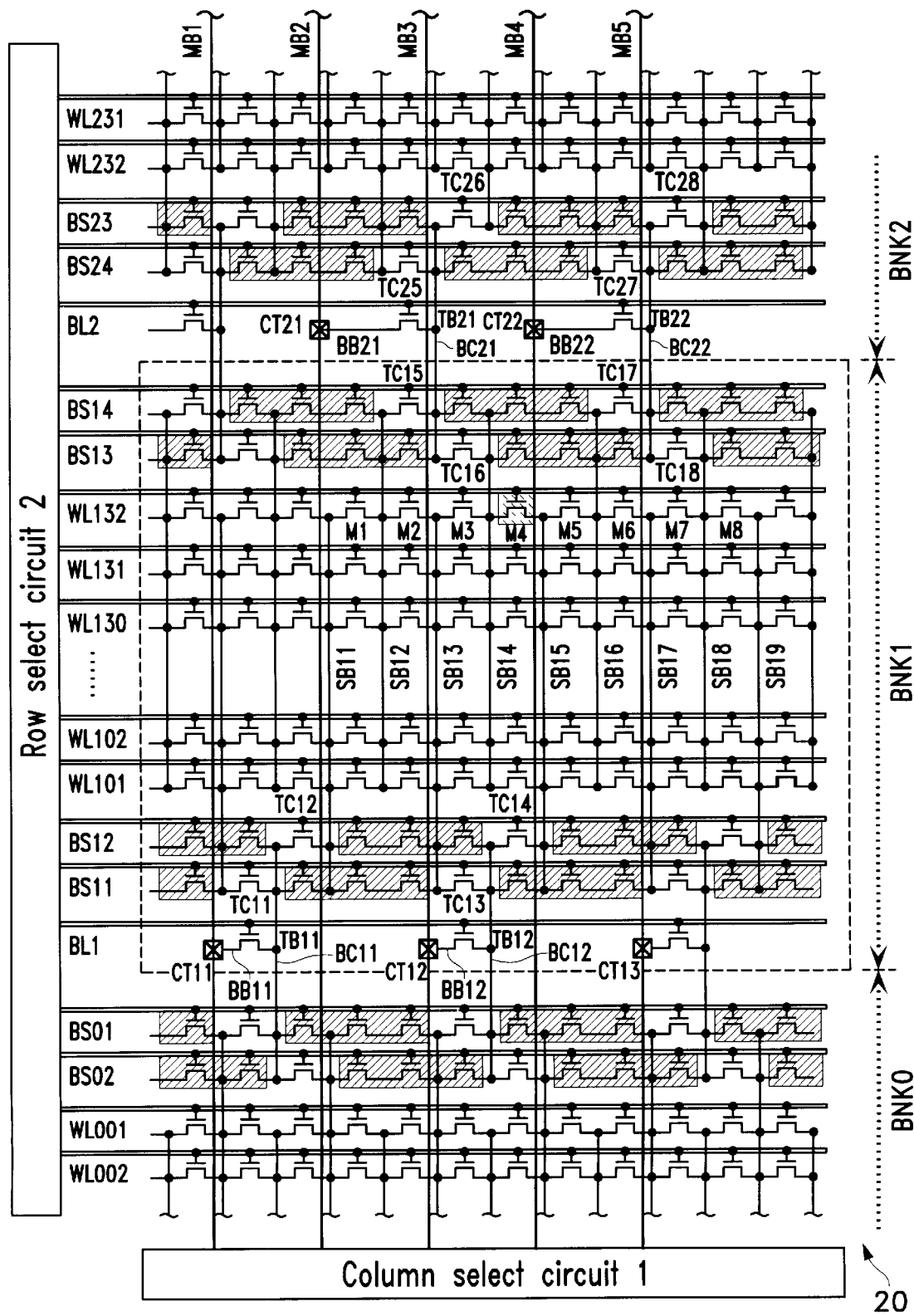
FIG. 4 shows a portion of an equivalent circuit in a mask ROM 20 capable of programming by ion implantation.

FIG. 4 shows a portion of an equivalent circuit in a mask ROM 20 capable of programming by ion implantation.

The mask ROM 20 includes a plurality of banks BNK0, BNK1 and BNK2. The configuration of the banks BNK of the mask ROM 20 is identical with that of the banks BNK of the mask ROM 10 shown in FIG. 1.

Two adjoining banks BNK share contacts CT, first auxiliary conduction regions BB, second auxiliary conduction regions BC, and first switches TB.

Specifically, only one first auxiliary conduction region BB is connected to a single contact CT.

The sub bit lines SB12 and SB14 are coupled to the second auxiliary conduction region BC21 through the second switches TC15 and TC16. The second auxiliary conduction region BC21 is coupled to the first auxiliary conduction region BB21 through the first switch TB21. The first auxiliary conduction region BB21 is coupled to the main bit line MB2 through the contact CT21. The sub bit lines SB16 and SB18 are connected to the second auxiliary conduction region BC22 through second switches TC17 and TC18. The second auxiliary conduction region BC22 is coupled to the first auxiliary conduction region BB22 through the first switch TB22. The first auxiliary conduction region BB22 is coupled to the main bit line MB4 through the contact CT22.

That is, the number of the main bit lines MB required in the mask ROM 20 of Embodiment 2 is greater than that required in the mask ROM 10 of Embodiment 1.

However, since two different first switches TB are not coupled to the same contact, it is not necessary to divide the first bank select line BL for controlling the first switch TB into two portions. For example, the first switches TB21 and TB22 can share the first bank select line BL2 so that the first switch TB21 and the second switch TB22 are controlled by the first bank select line BL2. Thus, the mask ROM 20 of Embodiment 2 can be operated with half the number of the first bank select lines BL required in the mask ROM 10 of Embodiment 1.

Hereinafter, an exemplary layout of a memory cell array in a mask ROM 20 will be described with reference to FIG. 5.

Figure 5:
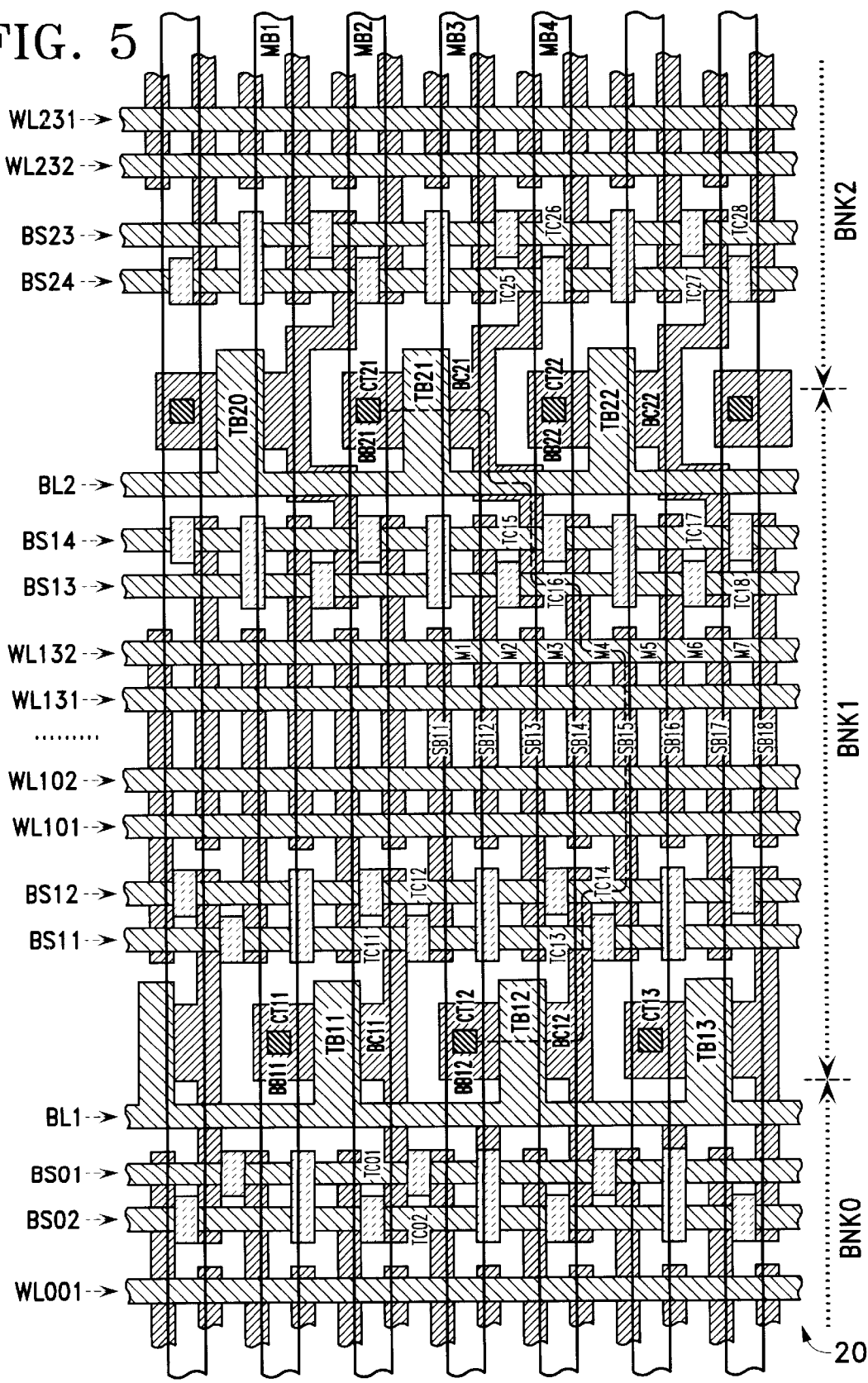
FIG. 5 shows an exemplary layout pattern of a memory cell array in the mask ROM 20.

FIG. 5 shows an exemplary layout of a memory cell array in a mask ROM 20.

The mask ROM 20 includes a $p^-$—type semiconductor substrate. A plurality of sub bit lines SB are formed from an $N^+$-type diffusion layer having an conductive type opposite to the conductive type of the semiconductor substrate. An insulating film is formed on the plurality of the sub bit lines SB, on which a plurality of word lines WL of a polysilicon layer are formed. The plurality of word lines WL cross the plurality of sub bit lines SB.

Memory cells M are formed between the sub bit lines SB. Specifically, a portion of the sub bit line SB functions as a source electrode or a drain electrode of the memory cells M, while a portion of the word line WL functions as a gate electrode.

The first auxiliary conduction region BB and the second auxiliary conduction region BC are formed from an $N^+$ diffusion layer having a conductive type identical with that of the sub bit lines. The first bank select line BL and the second bank select line BS are formed from polysilicon.

A first switch TB is formed between the first auxiliary conduction region BB and the second auxiliary conduction region BC. Specifically, a portion of the first auxiliary conduction region BB or the second auxiliary conduction region BC functions as a source electrode or a drain electrode of the first switch TB, while a portion of the first bank select line BL functions as a gate electrode of the first switch TB.

A second switch TC is formed between the second auxiliary conduction region BC and the sub bit line SB. Specifically, a portion of the second auxiliary conduction region BC or the sub bit line SB functions as a source electrode or a drain electrode of the second switch TC, while a portion of the second bank select line BS functions as a gate electrode of the second switch TC.

The first auxiliary conduction region BB is connected to the main bit line MB, which is a metal interconnection, through the contact CT. A broken line in FIG. 5 shows a path through which a current flows when data stored in the memory cell M4 is read out.

In Embodiments 1 and 2, the NOR type mask ROM has been described in which the programming is performed by the ion implantation. However, it is also possible to apply the present invention to other non-volatile memory devices, e.g., a NAND type mask ROM or an EEPROM which employ other layered bit line systems.

In Embodiments 1 and 2, a word line and a bank select line are made of polysilicon. However, the present invention is practicable in the case where the word line and the bank select line are made of polycide, silicide, or the like.

In the semiconductor memory device of the present invention, the plurality of sub bit lines included in a first bank are independent from the plurality of sub bit lines included in a second bank. Therefore, when data stored in a memory cell is read out, only two sub bit lines included in a bank including the memory cell are selected. Furthermore, in the semiconductor memory device of the present invention, the number of switches directly coupled to a single first auxiliary conduction region is one or two. Accordingly, a capacity between a gate and a drain or a junction capacity between a substrate and a drain is reduced. As a result, a load connected to a main bit line decreases, and data stored in the memory cell therefore can be read at a high speed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:

a plurality of main bit lines;

a first bank including a plurality of memory cells, a plurality of word lines, and a plurality of sub bit lines;

a second bank including a plurality of memory cells, a plurality of word lines, and a plurality of sub bit lines which are independent from the plurality of sub bit lines included in the first bank;

a first auxiliary conduction region coupled to one of the plurality of main bit lines;

a first switch for electrically connecting the first auxiliary conduction region to a second auxiliary conduction region; and a second switch for electrically connecting one of the plurality of sub bit lines included in the first bank to the second auxiliary conduction region.

2. A semiconductor memory device according to claim 1, wherein the first bank and the second bank share the first auxiliary conduction region, the second auxiliary conduction region, and the first switch.

3. A semiconductor memory device according to claim 1, further comprising a semiconductor substrate of one conductive type, wherein the plurality of sub bit lines included in the first and second banks have a conductive type opposite to the conductive type of the semiconductor substrate.

4. A semiconductor memory device according to claim 1, wherein the first and second auxiliary conduction regions have a conductive type identical with that of the plurality of sub bit lines included in the first and second banks.

5. A semiconductor memory device according to claim 1, further comprising:

another first switch for connecting the first auxiliary conduction region to another second auxiliary conduction region; and another second switch for connecting one of the plurality of sub bit lines included in the first bank to said another second auxiliary conduction region.

6. A semiconductor memory device according to claim 5, wherein the first auxiliary conduction region is interposed between the second auxiliary conduction region and said another second auxiliary conduction region.

7. A semiconductor memory device according to claim 1, further comprising another second switch for electrically connecting one of the plurality of the sub bit lines included in the first bank to the second auxiliary conduction region.

8. A semiconductor memory device according to claim 1, wherein a device isolation region formed by the LOCOS method is positioned around the first auxiliary conduction region.

9. A semiconductor memory device according to claim 1, wherein:

the plurality of memory cells included in the first bank are arranged in a matrix; and the plurality of memory cells included in the second bank are arranged in a matrix.

10. A semiconductor memory device according to claim 1, wherein:

each of the plurality of memory cells included in the first bank includes a gate electrode, a source electrode, and a drain electrode;

a portion of each of the plurality of word lines included in the first bank functions as the gate electrode of the plurality of memory cells included in the first bank;

a portion of each of the plurality of sub bit lines included in the first bank functions as one of the source electrode and the drain electrode of the plurality of memory cells included in the first bank;

each of the plurality of memory cells included in the second bank has a gate electrode, a source electrode, and a drain electrode:

a portion of each of the plurality of word lines included in the second bank functions as the gate electrode of the plurality of memory cells included in the second bank; and a portion of each of the plurality of sub bit lines included in the second bank functions as one of the source electrode and the drain electrode of the plurality of memory cells included in the second bank.

11. A semiconductor memory device according to claim 1, wherein:

the plurality of the sub bit lines included in the first and second banks are placed so as to be generally parallel to each other with a predetermined distance therebetween;

the plurality of the sub bit lines included in the first bank are in non-parallel relation to the plurality of the word lines included in the first bank; and the plurality of the sub bit lines included in the second bank are in non-parallel relation to the plurality of the word lines included in the second bank.

12. A semiconductor memory device according to claim 11, wherein:

the plurality of the word lines included in the first bank are parallel to the plurality of the word lines included in the second bank;

a bank select line is arranged so as to be generally parallel to the plurality of word lines included in the first and second banks; and a portion of the bank select line functions as a gate electrode of a bank cell.

13. A semiconductor memory device according to claim 11, wherein the plurality of main bit lines are made of metal interconnections and arranged so as to be generally parallel to the sub bit lines included in the first and second banks.

14. A semiconductor memory device according to claim 1, wherein a channel region of one of the plurality of memory cells included in the first bank is formed between two adjoining sub bit lines among the plurality of sub bit lines included in the first bank.

15. A semiconductor memory device according to claim 1, wherein:
- the plurality of the sub bit lines included in the first bank are parallel to the plurality of the sub bit lines included in the second bank; and
- the plurality of main bit lines are made of metal interconnections and arranged so as to be generally parallel to the plurality of sub bit lines in the first and second banks.

\* \* \* \* \*